United States Patent [19]

Malka et al.

[11] Patent Number: 4,603,298
[45] Date of Patent: Jul. 29, 1986

[54] REFERENCE SIGNAL GENERATOR

[75] Inventors: Jacob H. Malka, Fair Lawn; Harold Mate, Hackensack, both of N.J.

[73] Assignee: Allied Corporation, Morris Township, Morris County, N.J.

[21] Appl. No.: 685,663

[22] Filed: Dec. 24, 1984

[51] Int. Cl.[4] .......................... H03K 5/15; H03K 3/72; H03K 7/02

[52] U.S. Cl. ........................................ 328/62; 328/60; 328/152; 328/55

[58] Field of Search ................... 328/60, 62, 152, 153, 328/55

[56] References Cited

U.S. PATENT DOCUMENTS

| | | | |
|---|---|---|---|
| 3,832,641 | 8/1974 | Herchenrueder | 328/62 |
| 3,983,495 | 9/1976 | Epstein | 328/60 |
| 4,423,383 | 12/1983 | Svendsen | 328/62 |
| 4,485,479 | 11/1984 | Iino et al. | 328/60 |

*Primary Examiner*—John S. Heyman

*Attorney, Agent, or Firm*—Howard G. Massung; Stanley N. Protigal; Anthony F. Cuoco

[57] ABSTRACT

A reference signal generator is controlled by a central processing unit (20) via a multibus interface (22, 24, 26) and includes a plurality of signal channels (2, 4, 6, 8) selectively responsive to external signals ($E_c$, $E_m$) or internally generated signals ($I_c$, $I_{m2}$, $I_{m4}$, $I_{m6}$, $I_{m8}$) for providing carrier (12), modulating (16), or amplitude modulated (34) output reference signals ($E_{o2}$, $E_{o4}$, $E_{o6}$, $E_{o8}$) having a variety of waveforms. One of the signal channels (8) is arranged to sum the outputs of the other channels. Each of the channels includes an output attenuator (44, 46, 48, 50, 52, 56) which imparts a relatively high resolution to the output reference signals ($E_{o2}$, $E_{o4}$, $E_{o6}$, $E_{o8}$) and a circuit (54, 60, 62, 64, 66) which adjusts the range of said output reference signals. A built-in test capability (FIG. 3) is provided which permits selection and testing of the output reference signals from any one of the channels (2, 4, 6, 8).

14 Claims, 4 Drawing Figures

REFERENCE SIGNAL GENERATOR

BACKGROUND OF THE INVENTION

The testing of electrical equipment requires the use of reference signals (in some cases, the reference signals are provided by the equipment being tested) and determining the response of the equipment to the reference signals. The present invention is a versatile source of such reference signals in that it generates said signals in a variety of waveforms over a relatively wide range of frequencies and with a relatively high resolution. Additionally, the reference signal are generated as amplitude modulated signals with either full carrier or suppressed carrier characteristics as is advantageous for the intended purposes. In order to achieve maximum flexibility and a choice of signal waveforms, frequencies and amplitudes, the reference signal generator of the invention is arranged to communicate with a main central processing unit via a multibus interface. High resolution of the reference signal output is achieved through an arrangement of multiplying digital to analog converters and operational amplifiers. The reference signal generator of the invention as described accomplishes its purpose in a single, compact arrangement and provides a capability that would otherwise only be available by providing many separate signal sources.

Accordingly, it is an object of the present invention to avoid a multiplicity of separate reference signal sources by providing in a single compact arrangement a versatile reference signal generator for generating output reference signals of the type used for testing electrical equipment.

SUMMARY OF THE INVENTION

This invention contemplates a reference signal generator which communicates with a main central processing unit through a multibus interface for providing output reference signals having a variety of waveforms, frequencies and amplitudes. A novel arrangement of multiplying digital to analog converters and operational amplifiers imparts high resolution to the output reference signals. The invention features a plurality of independent signal channels, each of which is selectively responsive to either an external signal or an internally generated signal used either directly or as carrier signals to provide an output reference signal. Each of the plurality of channels except one is selectively responsive to either an external signal or a signal generated by a waveform synthesizer internal to the channel used either directly or as modulating signals to provide an output reference signal. The one channel is selectively responsive to the sum of output reference signals from others of the channels or to the signal generated by its internal waveform synthesizer used directly or as modulating signals to provide an output reference signal. A built-in test capability is provided which permits selection of the output reference signal from any one of the plurality of channels and converts the selected signal to a test signal.

DETAILED DESCRIPTION OF THE INVENTION

Figure 1:
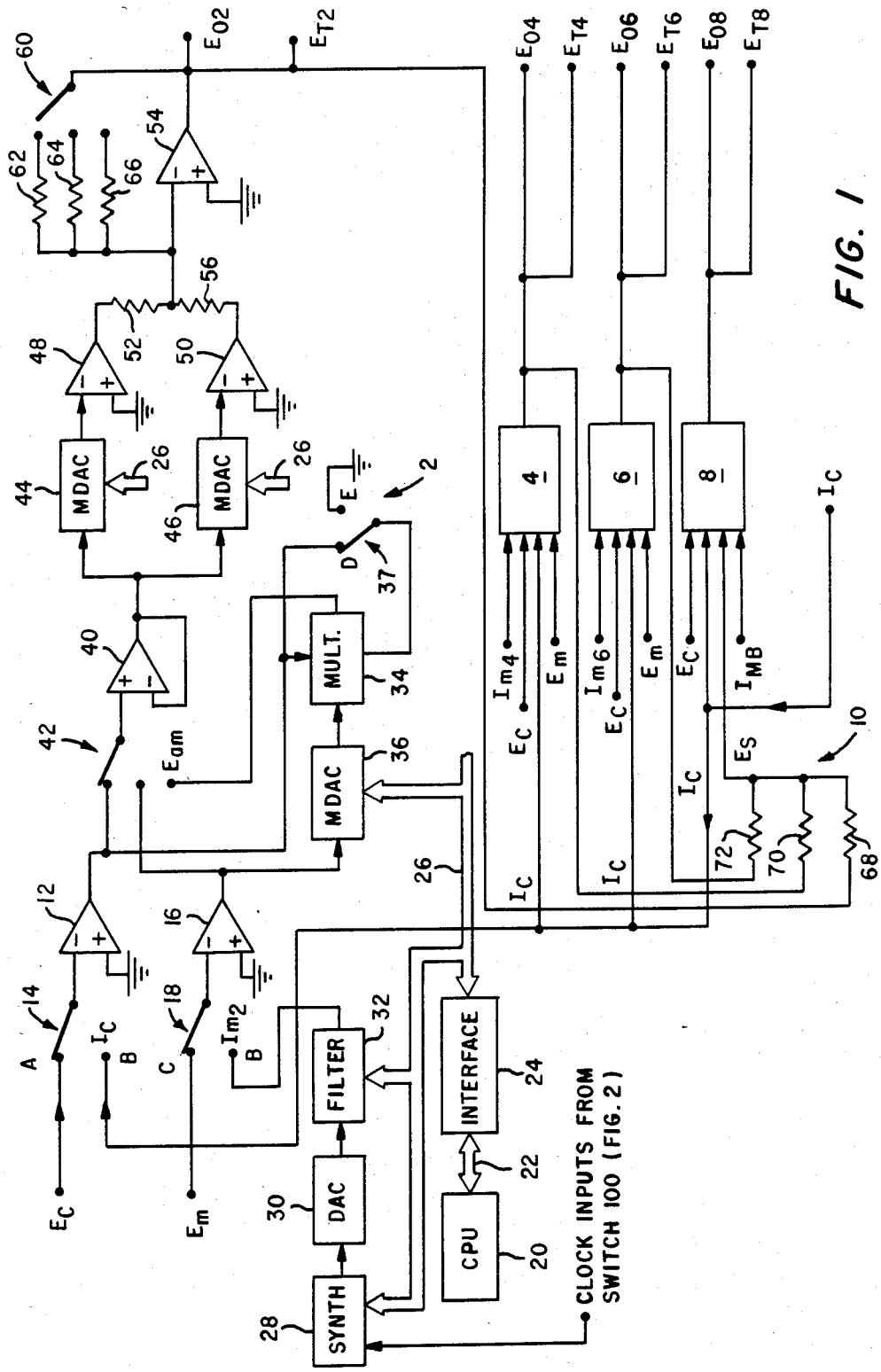
FIG. 1 is a block diagram-electrical schematic showing a portion of the invention.

With reference to FIG. 1, the reference signal generator of the invention includes a plurality of signal channels, shown for purposes of illustration as four in number and designated by the numerals 2, 4, 6 and 8. Channels 2, 4 and 6 are substantially alike. Channel 2 is shown in substantial detail and will be described as typical of the three channels. Channel 8 differs somewhat from channels 2, 4, and 6 as will be hereinafter described.

As shown in FIG. 1, each of the channels 2, 4, 6 and 8 is responsive to either an external signal $E_c$ or an internally generated signal $I_c$ for use in either a direct mode or in a carrier mode. Each of the three channels 2, 4 and 6 is selectively responsive to an externally generated signal $E_m$ or to signals $I_{m2}$, $I_{m4}$ and $I_{m6}$, respectively, generated internal to each of the channels for use in either a direct mode or in a modulating mode. Channel 8 is selectively responsive to internally generated signal $I_{m8}$ for use in a direct mode or in a modulating mode.

Channel 8 is arranged, through a summing network 10, to sum the output signals of channels 2, 4 and 6 and to be selectively responsive to a summation signal $E_s$ thereby provided and used in either a direct mode or a modulating mode as will be hereinafter more fully described.

Thus, with channel 2 being described in detail, external signal $E_c$ is applied to the inverting input terminal of an operational amplifier 12 through a switching device 14 having its arm in a position A. Signal $I_c$ is applied to the inverting input terminal of amplifier 12 when the arm is actuated to a position B. Operational amplifier 12 has a grounded non-inverting input terminal.

Signal $E_m$ is applied to the inverting input terminal of an operational amplifier 16 through a switching device 18 having its arm in a position C. Signal $I_{m2}$ is applied to the inverting input terminal of amplifier 16 when the arm is actuated to a position B. Amplifier 16 has a grounded non-inverting input terminal.

Signal $I_{m2}$ is generated internally to channel 2 by a waveform synthesizer 28 which has the capability of generating sine waves, triangular waves, square waves, random access memory (RAM) functions and user defined functions, as the case may be. Synthesizer 28 is controlled by CPU 20 via interface 22 and multibus 26 and provides a digital output which drives a digital to analog converter (DAC) 30. The output of DAC 30 is applied to a filter 32 likewise controlled by CPU 20 so as to smooth the output of the converter. Signal $I_{m2}$ is provided at the output of filter 32. Signals $I_{m4}$, $I_{m6}$ and $I_{m8}$ are likewise generated internally to their respective channels 4, 6 and 8, each of which includes a like synthesizer, digital to analog converter and filter.

The carrier signal provided at the output of amplifier 12 and the modulating signal provided at the output of amplifier 16 are used to generate an amplitude modulated signal $E_{am}$. Thus, the carrier signal from amplifier 12 is applied to a multiplier 34 and the modulating signal from amplifier 16 is applied through a multiplying digital to analog converter (MDAC) 36 to multiplier 34.

Multiplier 34 takes the product of the carrier and modulating signals to provide amplitude modulated signal $E_{am}$ at its output.

When the carrier signal provided by amplifier 12 is added to the output of multiplier 34 by virtue of the arm of a switching device 37 being actuated to a position D, the resulting signal is an amplitude modulated signal ($E_{am}$) with full carrier. When the carrier signal from amplifier 12 is not added to the output of multiplier 34 by virtue of the arm of switching device 37 being actuated to a grounded position E, an amplitude modulated signal ($E_{am}$) with suppressed carrier is provided. The degree of modulation of signal $E_{am}$ is controlled by MDAC 36 which in turn is controlled by CPU 20 via interface 24 and multibus 26 for adjusting the signal input to multiplier 34.

The carrier signal from amplifier 12, the modulating signal from amplifier 16 or the amplitude modulated signal ($E_{am}$) from multiplier 34 are selectively applied to a noninverting operational amplifier 40. The signals are applied to amplifier 40 through a switching device 42 having its arm selectively actuated so as to connect amplifier 40 either to amplifier 12, amplifier 16 or multiplier 34.

The output of amplifier 40 is applied to a multiplying digital to analog converter (MDAC) 44 having, for example, an eight-bit resolution, and is applied to a multiplying digital to analog converter (MDAC) 46 having, for purposes of illustration, a twelve-bit resolution. MDAC's 44 and 46 are controlled by CPU 20 via interface 24 and multibus 26. The arrangement is such that the eight-bit resolution of MDAC 44 and the twelve-bit resolution of MDAC 46 provide a total twenty-bit resolution to output reference signal $E_{o2}$ provided by an output operational amplifier 54.

The output of MDAC 44 is applied to the inverting input terminal of an operational amplifier 48 having a grounded non-inverting input terminal. The output of MDAC 46 is applied to the inverting input terminal of an operational amplifier 50 having a grounded non-inverting input terminal. The output of amplifier 48 is applied through a resistor 52 to the inverting input terminal of output operational amplifier 54 and the output of amplifier 50 is applied through a resistor 56 to the inverting input terminal of amplifier 54. Amplifier 54 has a grounded non-inverting input terminal. Thus, the outputs from MDAC 44 and MDAC 46 are summed by amplifier 54 which provides output reference signal $E_{o2}$.

In regard to the aforenoted twenty-bit total resolution, consider, for example, that the resistance of resistor 56 may be two hundred and fifty-six times the resistance of resistor 52. Thus, each voltage increment from MDAC 44 can be divided into four thousand and ninety-six increments by MDAC 46 to provide output reference signal $E_{o2}$ with a total twenty-bit resolution. All functions of the reference signal generator are controlled via a sixteen-bit data bus.

The gain of output operational amplifier 54 is adjustable via a feedback resistance network 58. Thus, the arm of a switching device 60 is actuated to connect one of the resistors 62, 64 or 66 in resistance network 58 to the inverting input terminal of amplifier 54 and to the output terminal thereof, thereby permitting several ranges of output reference signal $E_{o2}$.

In a like manner, channels 4 and 6 provide output reference signals $E_{o4}$ and $E_{o6}$, respectively.

In regard to channel 8, the output reference signals from channels 2, 4 and 6 are applied through resistors 68, 70 and 72, respectively, in summing network 10 to provide signal $E_s$ at the output of the summing network.

Figure 4:
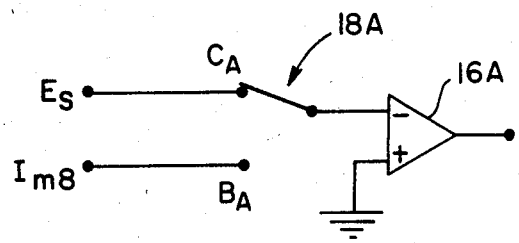
FIG. 4 is an electrical schematic diagram illustrating a particular difference between one of the signal channels and the other signal channels according to the invention.

As shown in FIG. 4, signal $E_s$ is applied to terminal $C_A$ of a switching device 18A and therefrom to the inverting input terminal of an operational amplifier 16A in channel 8. Channel 8 is thus selectively responsive to either signal $E_s$ or signal $I_{m8}$, generated as heretofore described with reference to channel 2, for providing output reference signal $E_{o8}$, also as heretofore described with reference to channel 2.

In this connection it will be understood that while channel 8 is shown and described as summing the outputs of all three channels 2, 4 and 6, it may be arranged to sum the outputs of less than all of these channels, as may be desireable in some cases and as will now be understood by those skilled in the art.

Figure 2:
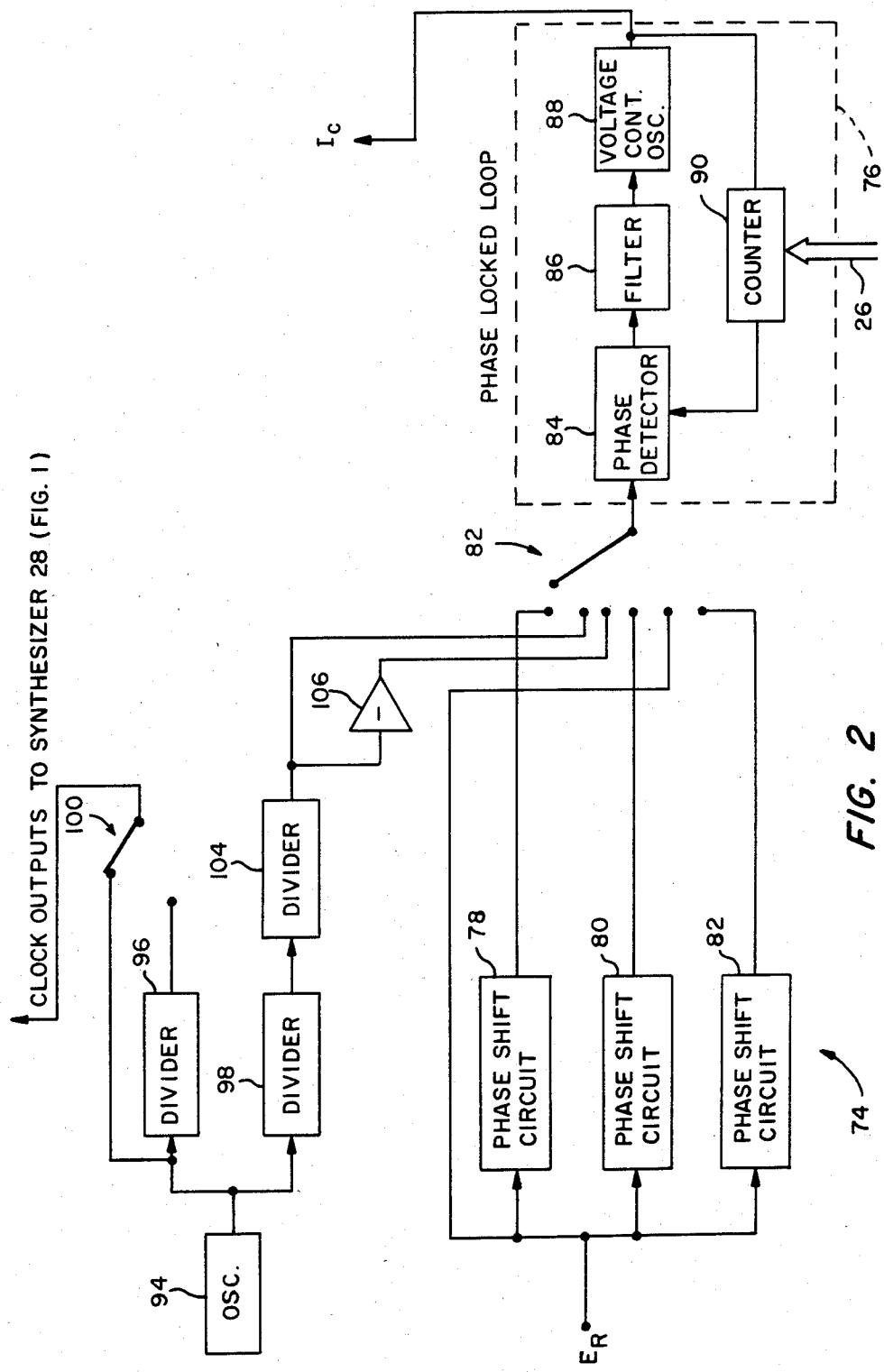
FIG. 2 is a block diagram-electrical schematic showing the portion of the invention not shown in FIG. 1.

With reference now to FIG. 2, signal $I_c$ is generated by a phase-shifting network designated generally by the numeral 74 and a phase-locked loop designated generally by the numeral 76. Phase-shifting network 74 includes phase-shift circuits 78, 80 and 82 each of which receives a reference signal $E_R$ and provides an output signal phase-shifted by a predetermined angle, each from the other.

A switching device 82 has an arm which is selectively actuated to connect either phase-shift circuit 78, 80 or 82 to phase-locked loop 76. Phase-locked loop 76 includes a phase detector 84 which receives the selected signal from phase-shift circuit 78, 80 or 82, as the case may be. The output from phase detector 84 is applied to a low pass filter 86 and therefrom to a voltage controlled oscillator 88. The output of voltage controlled oscillator 88 is fed back to phase detector 84 through a counter 90 which is controlled by CPU 20 via interface 24 and multibus 26. The output of voltage controlled oscillator 88 is signal $I_c$ which is applied to the several signal channels 2, 4, 6 and 8 as illustrated in FIG. 1.

In regard to reference signal $E_R$, it is noted that this signal can be an external signal whose phase has been shifted by some predetermined angle or a submultiple of a signal from an internal crystal oscillator 94. Thus, the output from oscillator 94 is applied to a divider 96 and to a divider 98, and which dividers divide the oscillator output by predetermined factors. The output of oscillator 94 and the output of divider 96 provide clock outputs which are selectively applied to synthesizer 28 in channel 2 (FIG. 1) and to the corresponding synthesizers in channels 4, 6 and 8 through the arm of a switching device 100 being selectively connected to either the oscillator or the divider.

The output of divider 98 is applied to a divider 104 which further subdivides the oscillator output and is applied therefrom to an inverting amplifier 106. The arm of switching device 82 is selectively actuated to connect either of the phase circuits 78, 80,82; reference signal $E_R$; divider 104; or amplifier 106 to phase detector 84 in phase-locked loop 76, and to thereby provide signal $I_c$ as a function of the selected signal.

Figure 3:
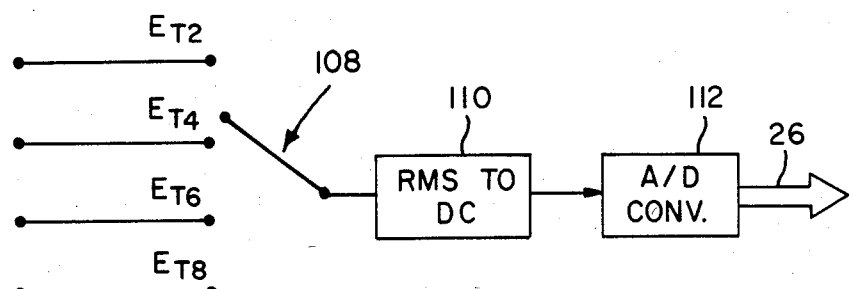
FIG. 3 is a block diagram-electrical schematic showing the built-in test feature of the invention.

With reference again to FIG. 1, the output reference signals of each of the signal channels 2, 4, 6 and 8 may be used as a test signal $E_{T2}$, $E_{T4}$, $E_{T6}$ and $E_{t8}$. As shown in FIG. 3, a switching device 108 has an arm which is selectively actuated to apply one of the test signals which are root mean square (RMS) signals, to an RMS to D.C. converter 110. The D.C. signal from converter 110, which is an analog signal, is applied to an analog to digital converter 112 and therefrom over multibus 26 to interface 24 and CPU 20 to provide a built-in test capability as will now be understood by those skilled in the art.

All functions of the reference signal generator i.e., actuation of the arms of switching devices 14, 18, 18A, 37 42, 60, 82, 100, 102 and 108 are controlled by CPU 20 via interface 22 and multibus 26 as will now be understood.

There has thus been described a versatile reference signal generator which generates reference signals in a variety of waveforms and over a wide range of frequencies. The reference signals are generated as amplitude modulated signals with either full carrier or suppressed carrier characteristics. The configuration of the invention is such that a multiplicity of separate reference signal generators is avoided and a single compact arrangement for providing the desired results is available. The feature of the invention wherein signal channel 8 sums the output reference signals from one or more of the other signal channels 2, 4 and 6 increases the versatility of the reference signal generator of the invention.

It will now be understood that the elements of the invention herein described and shown in the drawing are commercially marketed elements readily available as circuit cards or chips. The novelty of the invention therefore resides in the combination of these elements and not in the elements themselves.

With the aforegoing description of the invention in mind, reference is made to the claims appended hereto which define the scope of the invention.

What is claimed is:

1. A reference signal generator characterized by:
   a plurality of independent signal channels;
   each of the plurality of signal channels being responsive to a first input signal selected from a signal generated external to the reference signal generator and a signal generated internal to the reference signal generator, and used in one mode of a direct mode and a carrier mode for providing an output reference signal;
   each of the plurality of channels except one being responsive to a second input signal selected from a signal generated external to the reference signal generator and a signal generated internal to said each channel, and used in one mode of a direct mode and a modulating mode for providing an output reference signal; and
   the one channel being responsive to a second input signal selected from a signal which is the sum of the signals from others of the channels and a signal generated internal to the one channel, used in one mode of a direct mode and a modulating mode for providing an output reference signal.

2. A reference signal generator as described by claim 1, including means for generating the signal internal to the reference signal generator characterized by:
   a plurality of phase-shifting circuits;
   each of the plurality of phase-shifting circuits being responsive to a reference signal for providing a corresponding plurality of output signals, each being phase shifted from the other by a predetermined angle;
   a phase-locked loop; and
   means for selectively connecting one of the plurality of phase-shifting circuits to the phase-locked loop, whereupon the phase-locked loop is responsive to the output signal from the one phase-shifting circuit for providing the signal internal to the reference signal generator.

3. A reference signal generator as described by claim 1, including means for generating the signal internal to the reference signal generator characterized by:
   oscillator means for providing an oscillating signal;
   divider means connected to the oscillator means and responsive to the oscillating signal for providing a signal which is a submultiple of the oscillating signal;
   inverter means connected to the divider means for inverting the submultiple signal therefrom;
   a phase-lock loop, and
   means for selectively connecting one of the divider means and the inverter means to the phase-locked loop, whereupon the phase-locked loop is responsive to the signal from said one means for providing the signal internal to the reference signal generator.

4. A reference signal generator as described by claim 1, including means for generating the signal internal to the reference signal generator characterized by:
   a phase-locked loop responsive to an external reference signal and including a phase detector for detecting the phase of the reference signal, a filter for filtering the phase detected reference signal, a voltage controlled oscillator responsive to the filtered signal for providing the signal internal to the reference signal generator, and a counter connected to the voltage controlled oscillator and the phase detector, whereby a predetermined count of the signal from the voltage controlled oscillator is fed back to the phase detector.

5. A reference signal generator as described by claim 2, wherein the phase-locked loop is characterized by:
   a phase detector for detecting the phase of the output signal from the one phase-shifting circuit and for providing a phase detected signal;
   a filter connected to the phase detector for flitering the phase detected signal;
   a voltage controlled oscillator connected to the filter and responsive to the signal therefrom for providing the signal internal to the reference signal generator; and
   a counter connected to the voltage controlled oscillator and the phase detector, whereby a predetermined count of the signal from the voltage controlled oscillator is fed back to the phase detector.

6. A reference signal generator as described by claim 2, wherein the phase-locked loop is characterized by:
   a phase detector for detecting the phase of the signal from the one of the divider means and the inverter means and for providing a phase detected signal;
   a filter connected to the phase detector for filtering the phase detected signal;
   a voltage controlled oscillator connected to the filter and responsive to the signal therefrom for providing the signal internal to the reference signal generator; and
   a counter connected to the voltage controlled oscillator and the phase detector, whereby a predetermined count of the signal from the voltage controlled oscillator is fed back to the phase detector.

7. A reference signal generator as described by claim 1, wherein each of the signal channels includes means for generating the signal internal to said each channel characterized by:
   waveform synthesizer means for providing a predetermined digital output;

a digital to analog converter for converting the digital output from the synthesizer means to an analog output; and filter means for filtering the analog output and for providing the signal internal to said each channel.

8. A reference signal generator as described by claim 7, further characterized by:

oscillator means for providing an oscillating output;

divider means connected to the oscillator means for dividing the oscillating output by a predetermined factor and for providing a divided output; and means connected to the synthesizer means in each of the channels, the oscillating means and the divider means for selectively applying one of the oscillating and divided outputs as a clock input to said synthesizer means.

9. A reference signal generator as described by claim 1, further characterized by:

each of the channels including means responsive to the first input signal thereto for providing a carrier signal;

each of the channels including means responsive to the second input signal thereto for providing a modulating signal; and each of the channels including means responsive to the carrier signal and the modulating signal for providing an amplitude modulated signal.

10. A reference signal generator as described by claim 9, wherein the means responsive to the carrier signal and the modulating signal for providing an amplitude modulated signal is characterized by:

multiplier means connected to the carrier signal means and the modulating signal means for multiplying the signals therefrom to provide a signal which is the amplitude modulated signal.

11. A reference signal generator as described by claim 10, further characterized by:

means for selectively connecting and disconnecting the carrier signal means to and from the multiplier means;

an amplitude modulated signal with full carrier characteristics being provided when the carrier signal means and the multiplier means are connected so that their respective signals are added; and an amplitude modulated signal with suppressed carrier characteristics being provided when the carrier signal means and the multiplier means are disconnected.

12. A reference signal generator as described by claim 9, further characterized by:

means connected between the multiplier means and the modulating signal means for adjusting the modulating signal input to the multiplier means to control the degree of modulation of the amplitude modulated signal.

13. A reference signal generator as described by claim 10, wherein each channel includes means for imparting a relatively high resolution to he output reference signal provided by said channels characterized by:

first means having a first predetermined resolution;

second means having a second predetermined resolution;

means connected to the first and second means, the carrier signal means, the modulating signal means and the multiplier means, and selectively applying one of the carrier, modulated and amplitude modulated signals to said first and second means; and means connected to the first and second means for providing an output reference signal having a resolution with is the sum of the resolutions of the first and second means.

14. A reference signal generator as described by claim 13, further characterized by:

a plurality of resistors connected to an input of the means for providing an output reference signal; and means for selectively connecting one of said plurality of resistors to the output of the means for providing an output reference signal, whereby the range of said output reference signal is adjusted.

* * * * *